United States Patent [19]

Itoh et al.

[11] Patent Number: 5,470,799
[45] Date of Patent: Nov. 28, 1995

[54] METHOD FOR PRETREATING SEMICONDUCTOR SUBSTRATE BY PHOTOCHEMICALLY REMOVING NATIVE OXIDE

[75] Inventors: Hiromi Itoh; Masanobu Iwasaki; Akira Tokui; Katsuhiro Tsukamoto, all of Hyogo, Japan

[73] Assignee: Mitsubishi Denki Kabushiki Kaisha, Tokyo, Japan

[21] Appl. No.: 342,045

[22] Filed: Apr. 24, 1989

[30]     Foreign Application Priority Data

Apr. 28, 1988 [JP] Japan .................................. 63-108106
Oct. 24, 1988 [JP] Japan .................................. 63-267391

[51] Int. Cl.$^6$ .......................... H01L 21/00; H01L 21/02; H01L 21/302; H01L 21/463
[52] U.S. Cl. .................. 437/238; 437/235; 427/582; 427/583
[58] Field of Search ...................... 437/173, 225, 437/228, 235, 238, 239; 156/643, 646, 653, 657, 662; 148/DIG. 51; 427/53.1, 54.1

[56]           References Cited

U.S. PATENT DOCUMENTS 4,590,091  5/1986  Rogers, Jr. et al. .................... 437/173

FOREIGN PATENT DOCUMENTS 0176125  8/1986  Japan .
8700346  11/1987  WIPO .

OTHER PUBLICATIONS

Wolf, S., Silicon Processing for the VLSI Era, vol. 1, 1986, p. 367.
Ghandhi, S., VLSI Fabrication Principles, p. 509, Wiley & Sons, 1983.
R. Sugino et al., "Through-Oxide Cleaning of Silicon Surface by Photo-Excited Radicals" Extended Abstracts of the 19th Conference on Solid State Devices and Materials, Tokyo 1987, pp. 207–210.
E. Kinsbron et al., "Crystallization of Amorphous Silicon Films During Low Pressure Chemical Vapor Deposition", Appl. Phys. Lett. 42(9), 1 May 1983, pp. 835–837.

*Primary Examiner*—R. Bruce Breneman
*Assistant Examiner*—B. Everhart
*Attorney, Agent, or Firm*—Lowe, Price, LeBlanc & Becker

[57]           ABSTRACT

The present invention provides a method for removing a natural gas film or contaminant adhering on a surface of a silicon semiconductor substrate. The semiconductor substrate having the natural oxide film or contaminant adhered thereon is placed in a chamber. Then, a HCl gas is introduced into the chamber. The semiconductor substrate is heated at a temperature in the range of 200°~700° C., while ultraviolet rays are irradiated into the chamber. According to the method, the reaction of the natural oxide with HCl gas is promoted by a synergistic effect of light and heat energy. Therefore, the natural oxide film or contaminant can be removed at a lower temperature with the help of the light energy.

10 Claims, 10 Drawing Sheets

Si-Si3N4 INTERFACE

Si-Si3N4 INTERFACE 5,470,799

METHOD FOR PRETREATING SEMICONDUCTOR SUBSTRATE BY PHOTOCHEMICALLY REMOVING NATIVE OXIDE

BACKGROUND OF THE INVENTION

1. Field of the Invention

The present invention relates to a method for pretreating a surface of a semiconductor substrate which is a prestage for forming a thin film on the semiconductor substrate and, more particularly, to a method for removing a natural oxide film or a contaminant adhering to the surface of a semiconductor substrate.

2. Description of the Background Art

Since the characteristic of an electric device is strongly affected by the existence of an impurity introduced at an intentional or an unintentional accident during its manufacturing, it is necessary to hold the cleanliness of a manufacturing atmosphere at a high level throughout all processes. To that end, a high degree of cleaning and purification technique is used in a material, a method for forming a treatment atmosphere and the like.

The manufacturing processes for semiconductor devices are classified roughly into a thin film forming process and a circuit pattern forming process. The thin film forming process is further classified into various processes depending on the kind of film and its forming method, in which original or partially common cleaning technique has been developed. The pretreatment on a substrate before the formation of a thin film is an important and basic cleaning process common to all processes.

In the pretreatment processing, water washing, acid or alkali cleaning, chemical oxidation, dilute hydrofluoric acid treatment and the like are usually performed for the purposes of degreasing, and removing heavy metal and a natural oxide film.

Although these solution cleaning methods are widely adopted as an established process, a crucial problem is that a natural oxide film grows to some extent without exception especially when an active semiconductor surface or metal surface is exposed on the substrate because the substrate after treatment is surely exposed to the air during the time from the end of the treatment until the start of the thin film formation. Therefore, although the solution cleaning is effective in removing impurities of an organic substance, a heavy metal and the like, it cannot necessarily be means for obtaining a clean surface.

The growth of a natural oxide film has crucially a bad influence on the quality of a thin film in the later process of forming a thin film. The kinds of the above described thin film formation comprise, for example, epitaxial growth, formation of a refractory metal film on polysilicon (so called polycide structure), formation of wiring to make an electrical contact to a substrate, formation of an extremely thin insulating film and the like, and these processes will have an increased importance in the future as a high degree of integration is implemented.

Therefore, in order to form a thin film having well-controlled interface structure in a substrate, first it is most important to remove a natural oxide film growing on the semiconductor substrate surface, so that an excellent method for removing a natural oxide film is strongly demanded.

There is no excellent method for removing a natural oxide film, and the following technique is adopted at the present. That is, the technique is such that the substrate after solution cleaning is introduced to a thin film forming device and a natural oxide film is removed by sputter etching by means of plasma of an inert gas such as Ar or by gas etching by a hydrogen reducing method at a high temperature and, then, a thin film is formed continuously thereon. However, in the sputter etching by means of plasma of an inert gas such as Ar, the substrate is damaged. In addition, since a high temperature (usually more than 1,000° C.) is needed in a high temperature hydrogen reducing method, heat shear droop of a PN junction and the like is caused, so that its application is limited.

Although as a recent tendency in manufacturing a device, one having a small crystal grain diameter, that is, an almost amorphous one is preferred as crystalline material such as polysilicon, the grain diameter is increased in the material such as polysilicon which was exposed to a high temperature so that the high temperature hydrogen reducing method has many restrictions also in this respect, as pointed out by E. Kinsbron, M. Sternheim, and R. Knoell, in *Appl. Phys. Lett.*, Vol. 42, No. 9,835, 1 May (1983).

In addition, it is known that chlorine radicals excited by ultraviolet light can be used to clean silicon surfaces through native oxide (Extended Abstract of the 19th Conference on Solid State Devices and Materials, Tokyo, 1987, pp. 207–210). However, the cleaning effects were not sufficient.

The present invention was made to solve the above described problems and it is an object of the present invention to provide a method for pretreating a semiconductor substrate surface by which a natural oxide film or contaminant attached onto the semiconductor substrate surface can be removed at a sufficiently low temperature without damaging the semiconductor substrate surface.

The present invention is most important in that a reaction gas to be used does not absorb irradiation light and, therefore, photochemical excitation is not performed in a vapor state, so that there are some cases where a remarkable light irradiation effect can be attained if the surface of the substrate is irradiated with light and the substrate is heated appropriately even in a reaction system in which the light irradiation is regarded as invalid. Conventionally, many attempts have been reported in which the semiconductor substrate surface just before the film formation is pretreated at a low temperature with no damage, using the photochemical reaction as intended by the present invention. However, all of them had the fixed idea that it was necessary for the reaction gas to absorb the irradiation light as a photochemical process, so that there were many restrictions in coupling the reaction gas and the irradiation light source. In fact, since originally the photochemistry of gas which was one theoretical background of photoexcitation processing was mainly directed to the photochemistry in the vapor state, it was essential for the reaction gas to absorb the irradiation light to achieve a photochemical process. In addition, in applying the photochemistry to the semiconductor device manufacturing process, the influence of temperature on the treated substrate serving as absorbent was ignored when the photochemistry in the state absorbed into the solid surface was considered. Although the substrate to be treated was heated in many cases in a photoexcitation CVD method and the like, this heating was performed in order to improve a film quality such as minuteness of a deposited film, so that the photochemical reaction itself occurred even if the heating was not performed. In other words, it is understood that the influence of heat energy on the photochemical process was not considered at all in a conventional system of the photochemical reaction or photoexcitation process. The present invention aimed at this respect and various experiments were performed. As a result, it was found that there were some cases in which excitation similar to the photochemical excitation occurred when even a reaction gas which did not absorb the irradiation light in the vapor state was absorbed in the substrate of a high temperature and thus the present invention was completed.

More specifically, the present invention provides a method for removing a natural oxide film or contaminant attached on the surface of a semiconductor substrate and the inventive method comprises the steps of placing the above described semiconductor substrate in a chamber; introducing to the chamber an inert gas capable of reacting with the above described natural oxide film or contaminant; heating the above described semiconductor substrate to a temperature within the range of 200°–700° C.; and irradiating the above described heated semiconductor substrate with the light having a wavelength which causes the photochemical reaction of the reaction gas introduced into the above described chamber with the natural oxide film or contaminant adhering on the semiconductor substrate surface at a temperature within the range of 200°–700° C. while the above described semiconductor substrate is heated.

The reaction gas used in the present invention is generally hydrogen chloride gas, hydrogen gas, chlorine gas or the like, and particularly hydrogen chloride gas is preferably used. The semiconductor substrate is heated to a temperature within the range of 200–700° C. Although a detailed description is made with data shown hereinafter, a temperature not within the range of 200°–700° C. is not preferable because a treatment speed of the natural oxide film is slow below 200° C. and the above mentioned heat shear droop and undesired increase in the grain diameter in the crystalline material are caused above 700° C. while the treatment speed of a natural oxide film becomes faster.

If the irradiation light has a wavelength causing the photochemical reaction of the reaction gas introduced in the chamber with a natural oxide film or contaminant on the semiconductor substrate surface at a temperature within the range of 200°–700° C. while the semiconductor substrate is heated, any light can be used. Particularly, the irradiation light from a low pressure mercury lamp, a high pressure mercury lamp, mercury-xenon lamp, excimer laser or the like is preferable.

Although the irradiating direction of the above described light is preferably toward the semiconductor substrate surface, a direction parallel to the semiconductor substrate surface may be adopted. When the light is irradiated in a direction toward the semiconductor substrate surface, the low pressure mercury lamp, the high pressure mercury lamp and the mercury-xenon lamp of the above described light sources are preferably used as a light source.

When the light is irradiated in a direction parallel to the semiconductor substrate surface, particularly the excimer laser light is preferably used.

The pressure in the atmosphere of the reaction gas is preferably selected to be within the range of atmospheric pressure to 0.1 Torr.

In addition, for the same purpose, the light may be used as means for heating the semiconductor substrate to a temperature within the range of 200°–700° C. The light source for heating the semiconductor substrate may be the same as that irradiating the reaction gas. In this case, an argon-arc lamp and a xenon-mercury lamp are preferably used. Furthermore, the light for heating the semiconductor substrate may be infrared rays and the light with which the reaction gas is irradiated may be ultraviolet rays.

As described above, the present invention uses both light and heat to remove a natural oxide film or contaminant adhering on the surface of a semiconductor substrate using a reaction gas. When a HCl gas is used as a reaction gas, the natural oxide film is removed from the substrate in accordance with the following reaction formula:

$$SiO_2 + 4HCl \rightarrow SiCl_4 + 2H_2O$$

The present invention makes use of the fact that this reaction is promoted by a synergistic effect of light and heat energy. Therefore, even if a reaction gas which can not be activated only by light is used, a natural oxide film or contaminant can be removed by the reaction gas. In addition, even when the natural oxide film or contaminant can be removed only under a high temperature, the natural oxide film or contaminant can be removed at a lower temperature with the help of the light energy.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10A and 10B are schematic diagrams of a device for implementing still another embodiment of the present invention, wherein FIG. 10A is a plan sectional views and FIG. 10B is a sectional view taken along a line A—A in FIG. 10A.

DESCRIPTION OF THE PREFERRED EMBODIMENTS

A description is made of an embodiment of the present invention.

In this embodiment, a hydrogen chloride gas was used as a reaction gas and a low pressure mercury lamp was used as a light source. Ultraviolet rays from this low voltage mercury lamp were mainly the light having the wavelengths of 1,849 Å and 2,537 Å. A silicon substrate was used as a semiconductor substrate.

Used device

Figure 1:
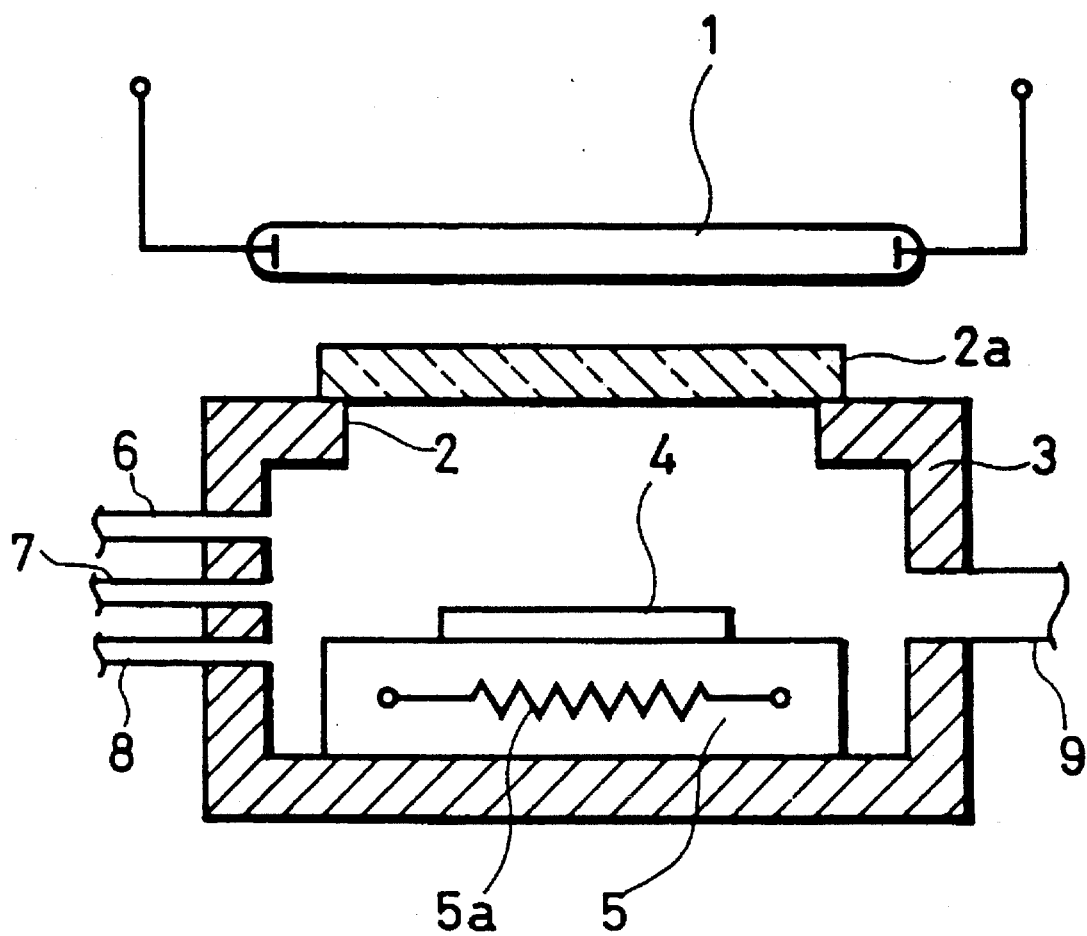
FIG. 1 is a sectional view of a device for implementing one embodiment of the present invention.

FIG. 1 is a sectional view of a device for implementing an embodiment of the present invention. The device comprises also an attached device for analyzing a pretreated substrate.

Referring to FIG. 1, the processing device comprises a chamber 3. The chamber 3 comprises a cleaning gas inlet 6, a SiH$_2$Cl$_2$ gas inlet 7, an NH$_3$ gas inlet 8 and an outlet 9. In addition, the chamber 3 comprises an ultraviolet entrance window 2 from which ultraviolet rays are irradiated into the chamber 3. A window 2 comprises a plate 2a which is made of transparent materials. A low pressure mercury lamp 1 is provided opposite to the ultraviolet rays entrance window 2. A substrate supporting plate 5 is placed in the chamber 3 and a silicon substrate 4 is put on the substrate supporting plate 5. The substrate supporting plate 5 comprises heating means 5a for heating up the silicon substrate 4 through the substrate supporting plate 5.

Outline of method for pretreating semiconductor substrate surface

An outline of a method for pretreating a semiconductor substrate surface is described with reference to the above described device.

The silicon substrate 4 is put on the substrate supporting plate 5. Although solvent treatment was performed on the silicon substrate 4, a natural oxide film has been already formed because the substrate 4 was exposed to the air. Then, a HCl gas is introduced into the chamber 3 through the cleaning gas inlet 6 and the HCl gas is supplied on the surface of the silicon substrate 4. The surface of the silicon substrate 4 is irradiated with ultraviolet rays from the ultraviolet rays entrance window 2 by turning on the low pressure mercury lamp 1. The silicon substrate 4 is heated to 200°~700° C. at the same time of this ultraviolet rays irradiation. Then, for example the following reaction is promoted by the synergetic effect of heat and light, and the natural oxide film on the silicon substrate 4 is removed.

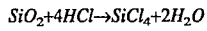

$$SiO_2 + 4HCl \rightarrow SiCl_4 + 2H_2O$$

Method for confirming the effect of the present invention

Although the natural oxide film is removed as described above, some measures have to be taken in order to confirm whether the natural oxide film is removed or not and to evaluate the effect of the present invention. Because silicon is very likely to be oxidized and even if the natural oxide film is removed in accordance with the above described embodiment, the surface is oxidized again as soon as the silicon substrate is taken out of the device to confirm its effect. Therefore, two methods have been proposed in order to evaluate the effect.

First method for confirming effect

The first confirming method comprises the steps of performing pretreatment on a silicon substrate in accordance with the present invention, removing the natural oxide film from the surface of the silicon substrate, depositing a thin film not comprising oxygen such as silicon nitride film thereon, and observing an element profile in the direction of film thickness by Auger electron spectroscopy and the like. According to this method, the existence of a natural oxide film is determined by detecting a signal of oxygen in the vicinity of the interface between the silicon substrate (Si) and a deposit film (Si$_3$N$_4$).

Figure 2A:
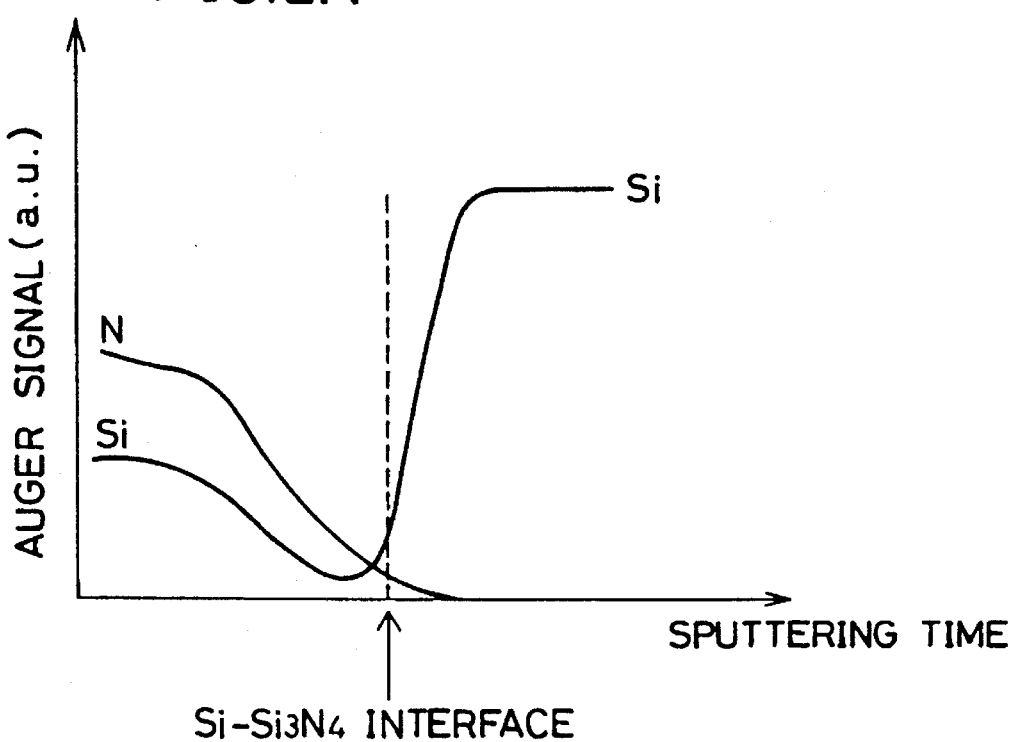
FIGS. 2A and 2B are graphs for describing a first method evaluating the effect of the present invention.

FIG. 2A is a Auger profile in the direction of film thickness of a sample which is provided by depositing the silicon nitride film by a CVD method immediately after the pretreatment is performed in accordance with the present embodiment. The sample supplied for the Auger electron spectroscopy was made as follows.

Referring to FIG. 1, the silicon substrate 4 after the solution cleaning was put on the substrate supporting plate 5. Since this silicon substrate 4 was exposed to the air, the natural oxide film was already formed thereon. Then, the HCl gas was introduced into the chamber 3 through the cleaning gas inlet 6 and a HCl gas was provided on the surface of the silicon substrate 4. The substrate was heated at a temperature within the range of 200°~700° C. at the same time ultraviolet rays were irradiated on the surface of the silicon substrate 4 to perform the removing process of the natural oxide film. The HCl gas was provided for several minutes. Then, the HCl gas was evacuated from the outlet 9, SiH$_2$Cl$_2$ gas was introduced from the SiH$_2$Cl$_2$ gas inlet 7 and NH$_3$ gas was introduced from the NH$_3$ gas inlet 8 to deposit a silicon nitride film on the silicon substrate 4 by a CVD method. This was provided for the Auger electron spectroscopy analysis. In FIG. 2A, the abscissa shows a sputtering time and the ordinate shows a Auger signal. As apparent from the FIG. 2A, in a sample treated (with HCl) in accordance with the present invention, a signal of oxygen was not detected in the vicinity of the interface between Si and Si$_3$N$_4$.

Figure 2B:
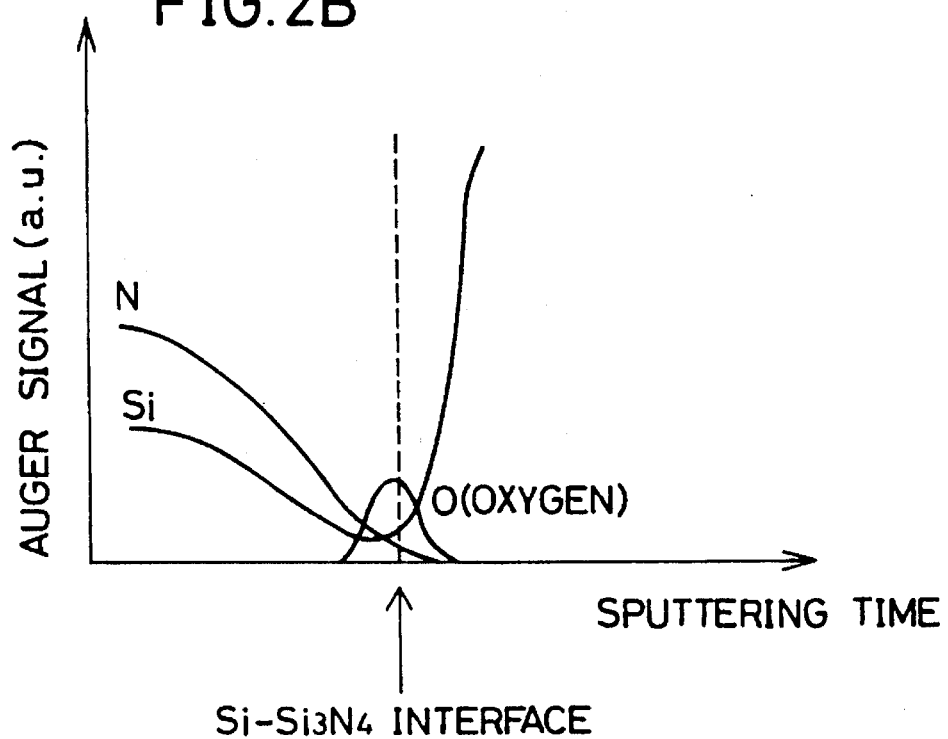

FIG. 2B is an element profile in the direction of film thickness deposited with Si$_3$N$_4$ without being treated (with HCl) in accordance with the present invention. As apparent from FIG. 2B, a signal of oxygen was detected in the vicinity of the interface between Si and Si$_3$N$_4$.

As a result, it is confirmed that the natural oxide film was reliably removed when pretreated in accordance with the present embodiment.

Second evaluating method

The second method for confirming the effect of the present invention comprises the steps of emitting photoelectrons by irradiating the silicon substrate with ultraviolet rays before and after the treatment and measuring a change of the amount of emitted electrons (photocurrent). This method could be good means for determining the existence of a natural oxide film because the existence of a natural oxide film has a remarkable effect on the amount of photocurrent.

In addition, the method is advantageous in that the conditions of a natural oxide film being removed can be monitored by tracking a photocurrent, because ultra rays used for removing a natural oxide film in the present invention can be used as ultraviolet rays causing the emission of the photoelectrons.

Figure 3A:
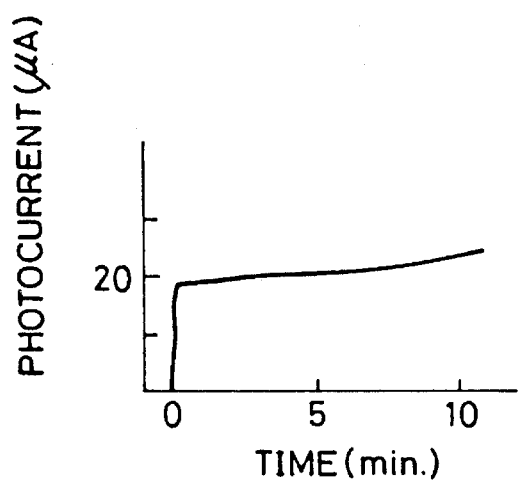
FIGS. 3A and 3B are graphs for describing a second method evaluating the effect of the present invention.
Figure 3B:
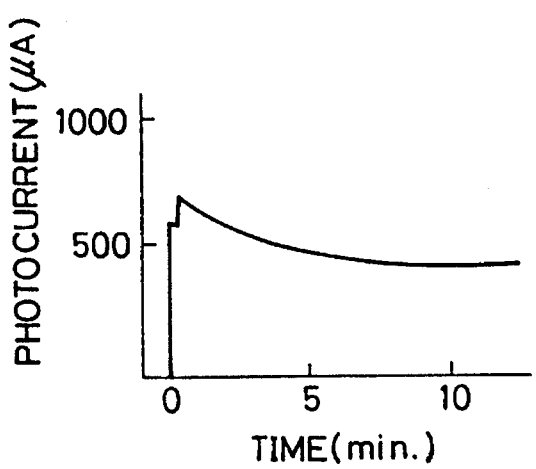

Referring to FIGS. 3A and 3B, a description is made of the relation between a photocurrent and the existence of a natural oxide film. These figures are graphs in which a current of the emitted photoelectrons is tracked in Argon atmosphere after the start of the irradiation of ultraviolet rays on the substrate at 500° C. FIG. 3A is data derived from a silicon substrate which had been exposed to HCl under the irradiation of ultraviolet rays for 15 minutes at 550° C. and corresponds to FIG. 2A. FIG. 3B is data derived from a silicon substrate which was not treated as described above and corresponds to FIG. 2B.

As apparent from these figures, when the treatment in accordance with the present invention was performed, the photocurrent was remarkably reduced. According to the effects of FIGS. 2A and 3A, it is understood that the photocurrent was decreased because the natural oxide film was removed.

In addition, it is easily understood that the conditions of the natural oxide film being removed can be monitored by tracking the degree of decrease in the photocurrent.

Proof that natural oxide film is removed by synergistic effect of heat reaction and light reaction which is characteristic to the present invention In view of the effects of FIGS. 3A and 3B, it is proved that the natural oxide film is removed by the synergistic effect of heat reaction and photochemical reaction in accordance with the present invention.

Figure 4A:
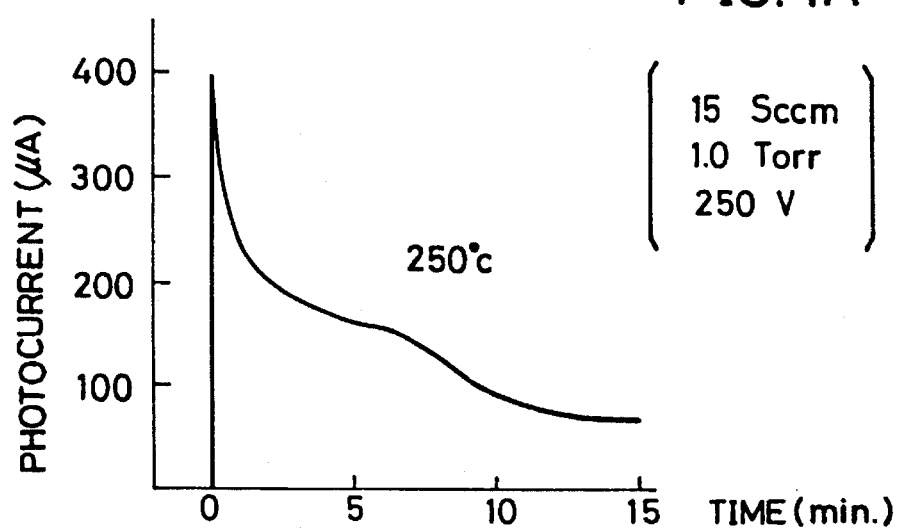
FIGS. 4A, 4B, 4C and 4D are graphs showing a temperature effect of the present invention.
Figure 4B:
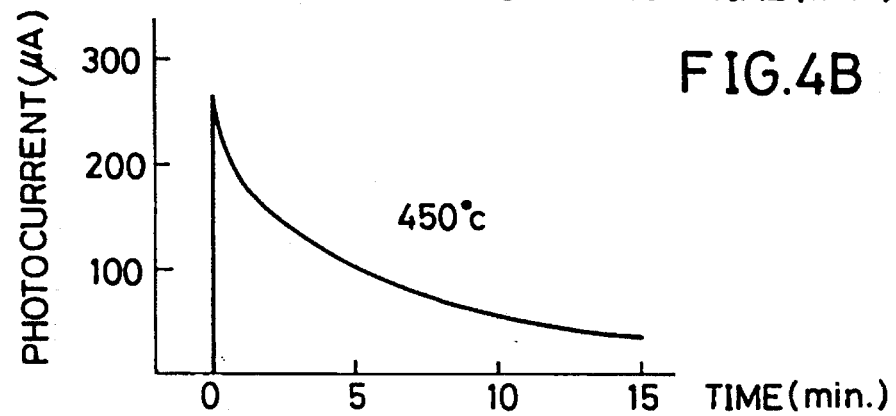
Figure 4C:
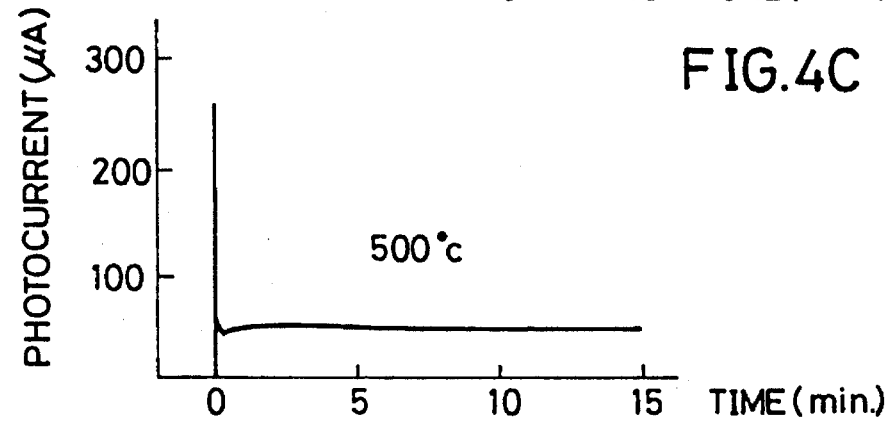
Figure 4D:
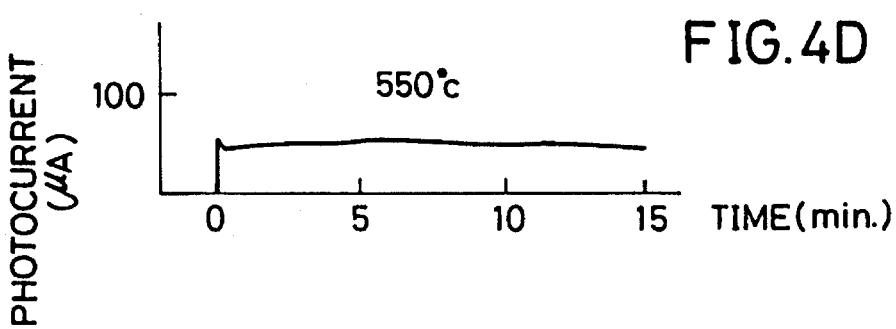

FIGS. 4A, 4B, 4C and 4D are graphs showing the change of photocurrent when the treatment in accordance with the present invention is performed at respective substrate temperatures shown in those figures. More specifically, it is shown how the method of the present invention depends on the temperature. FIG. 4A is a graph showing the change of photocurrent when the substrate is at 250° C. FIG. 4B is a graph showing the change of photocurrent when the substrate is at 450° C. FIG. 4C is a graph showing the change of photocurrent when the substrate is at 500° C. FIG. 4D is a graph showing the change of photocurrent when the substrate is at 550° C. In these figures, the abscissa shows time (minutes) and the ordinate shows a photocurrent (μA). The photocurrent was measured by putting the substrate in HCl atmosphere at respective temperatures, starting the irradiation of ultraviolet rays and tracking a photocurrent value as a function of the time. From FIGS. 4A to 4D, the following effects were recognized.

(1) The photocurrent at all temperatures was decreased as a function of irradiation of the ultraviolet rays irradiation.

(2) The decrease rate of the photocurrent was rapidly increased as the temperature of the substrate was raised.

(3) The photocurrent after decreasing was held at a certain value regardless of the substrate temperature.

Since the decrease in the photocurrent is in connection with the removal of the natural oxide film as described above, it is suggested that the higher the temperature becomes, the higher the speed of removing the natural oxide film becomes so that the speed is accelerated by heat. In addition, according to a data book, HCl in an ordinary temperature and atmosphere only absorbs ultraviolet rays having a wavelength of approximately 150 nm or less. Therefore, HCl is not excited by the light irradiated from the low pressure mercury lamp (ultraviolet rays having wavelengths of 1,849 Å and 2,537 Å) and it is impossible to remove the natural oxide film. However, by heating the substrate at a temperature within the range of 200°~700° C., the natural oxide film can be removed as shown in FIGS. 4A to 4D. As a result, it is concluded that the removal of the natural oxide film in accordance with the present invention is implemented by the synergistic effect of heat and light also in this respect.

In addition, although under the time restriction such that pretreatment is performed before the formation of the thin film, the above described effect shows that the substrate temperature is preferably approximately 500° C. or more, the remarkable decrease in temperature has been attained even at this temperature as compared with the case of using only heat reaction so that its practicability can be very significant.

Figure 5:
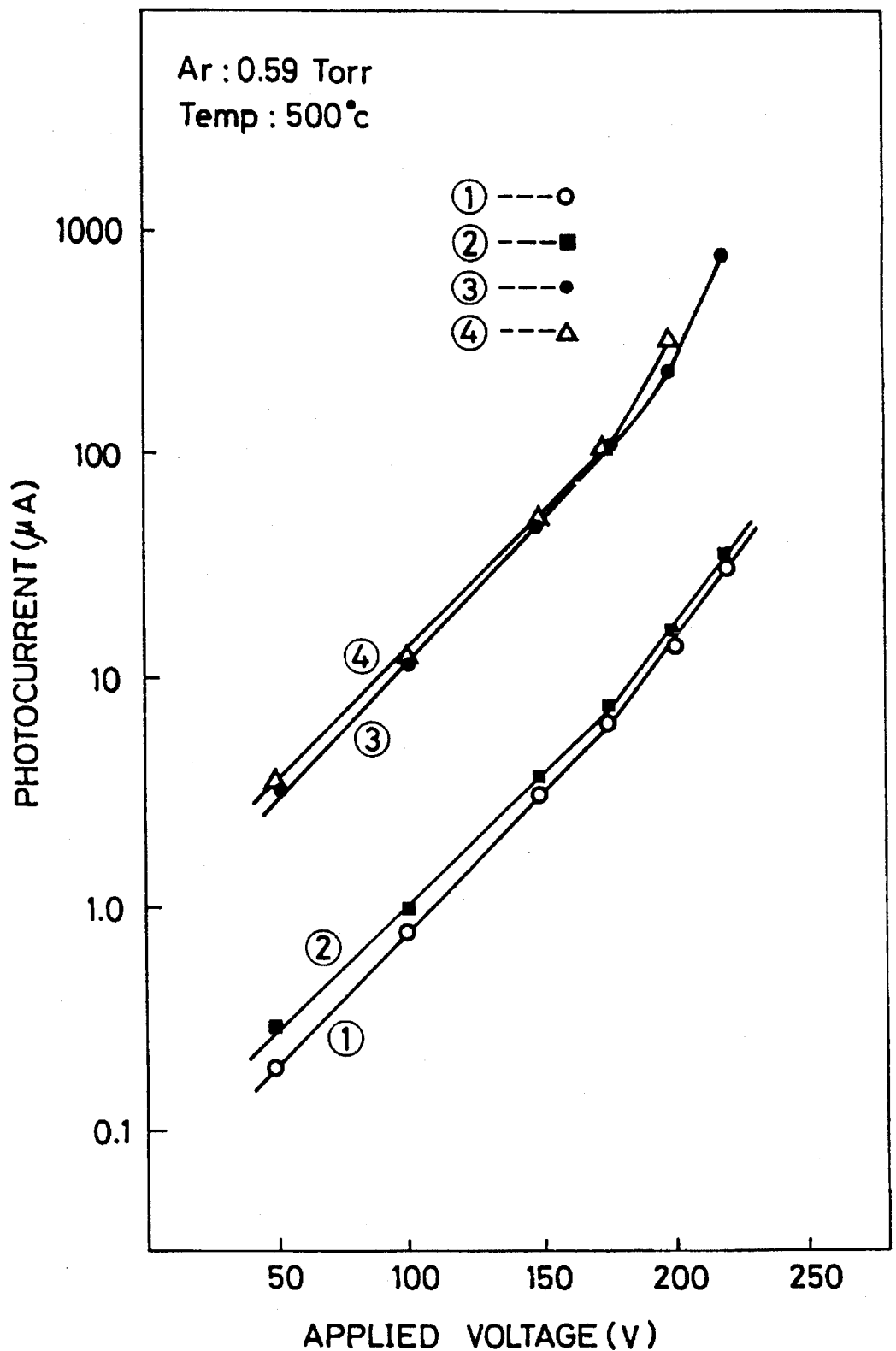
FIG. 5 is a graph showing an ultraviolet irradiation effect of the present invention.

FIG. 5 is a graph showing the irradiation effect of ultraviolet rays by a pretreatment method in accordance with the present invention. The experimental device actually used was the device shown in FIG. 1 to which a photoelectron collector electrode was attached. This photoelectron collector electrode was a mesh-type electrode and placed between the silicon substrate 4 and the ultraviolet rays entrance window 2. In this embodiment, the photocurrent was measured by changing the voltage applied to the photoelectron collector electrode at the substrate temperature of 500° C. in an Ar atmosphere using the following substrate.

As a substrate for measuring the photocurrent, the following four kinds were selected.

(1) A substrate to which HCl was exposed for 15 minutes at 500° C. with irradiation of ultraviolet rays (the treatment of the present invention was performed).

(2) A substrate to which HCl was exposed for 15 minutes at 500° C. with irradiation of ultraviolet rays while a voltage +250 V was continuously applied to a photoelectron collector electrode.

(3) A substrate to which HCl was exposed for 15 minutes at 500° C. without irradiation of ultraviolet rays.

(4) A substrate to which HCl was not exposed at all (but irradiation with ultraviolet rays was performed for 15 minutes in an Ar atmosphere at 500° C.).

As apparent from FIG. 5, the photocurrent characteristic was clearly divided into a group comprising (1) and (2) and a group comprising (3) and (4). As a result, the following facts were obtained. That is, as obvious as compared with (1) and (3), the HCl treatment had no effect when there was no irradiation of ultraviolet rays even at a high temperature of approximately 500° C. Furthermore, as apparent as compared with (1) and (4), the HCl exposure was indispensable in removing the natural oxide film. Since this fact was described in the description of FIGS. 2A, 2B, 3A and 3B, a description thereof is omitted here.

Although a question might arise whether a natural oxide film could be removed by HCl plasma which was generated from an external electric field applied during the measurement of the photocurrent if only effects of FIGS. 4A to 4D were referred to, such question is eliminated by the fact that there is no difference between photocurrent values as compared as with (1) and (2).

Referring to FIG. 5, since the photocurrent is increased along with the increase in an applied voltage because of an electron multiplying action in Ar serving as atmospheric gas for measurement, there is no significant meaning for the present discussion. As described above, it can be concluded that it becomes possible to remove a natural oxide film for the first time by the synergetic effect of heat and light. Therefore, it is possible to remove a natural oxide film even with a reaction gas not capable of being activated only by light. In addition, even when a natural oxide film can be removed only under an extremely high temperature, the natural oxide film can be removed at a lower temperature with the help of light energy.

Reason why heating temperature of semiconductor substrate is preferably within the range of 200°~700° C.

An experiment was made to obtain the range of preferable substrate temperatures in the method for removing a natural gas oxide film.

Figure 6:
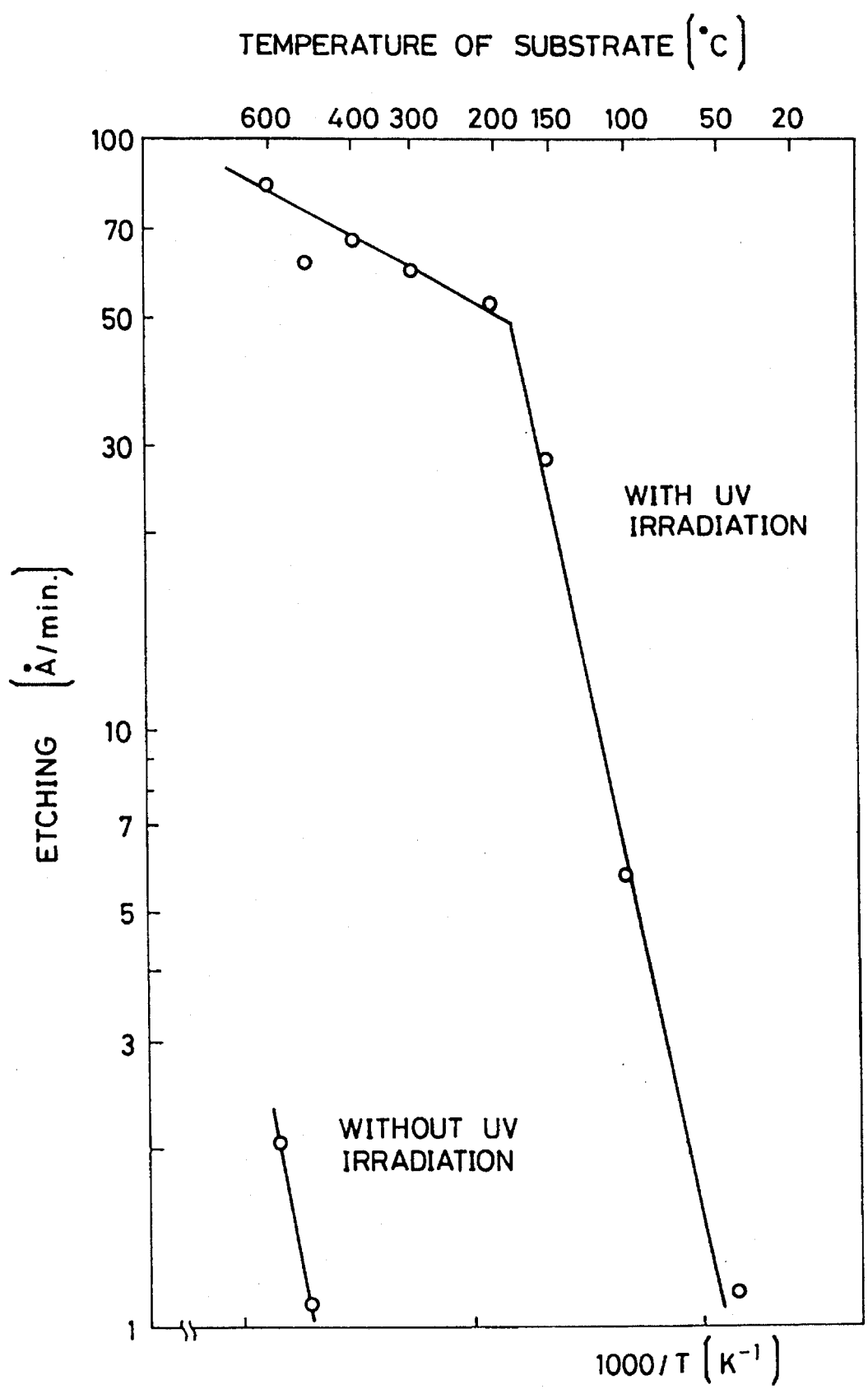
FIG. 6 is a graph Arrhenius plot the relation between etching speed and temperature of a silicon substrate.

FIG. 6 is an Arrhenius plot (log (etching rate) vs. 1/T) showing the relation between speed and temperature when a silicon substrate was etched in UV-HCl system. In this figure, the etching speed of the silicon substrate was taken instead of the removing speed of the natural oxide film. This was because the natural oxide film was too thin to determine the removing speed, so that it was thought to obtain an etching speed of the silicon substrate to estimate the removing speed of the natural oxide film from the etching speed of this silicon substrate. Needless to say, since the natural oxide film exists on the surface of the uppermost layer of the substrate silicon, it follows that when the substrate silicon is etched, the natural oxide film is also etched and removed.

Figure 7A:
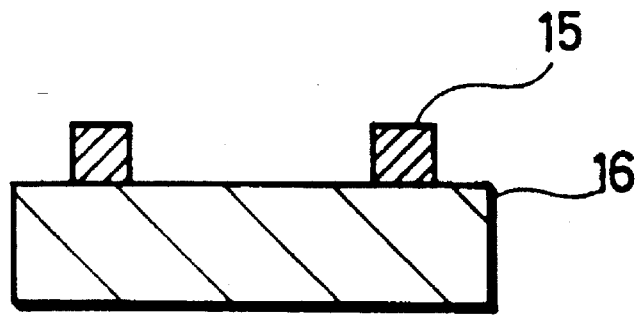
FIGS. 7A, 7B and 7C are diagrams showing a method for obtaining the etching speed of a silicon substrate.
Figure 7B:
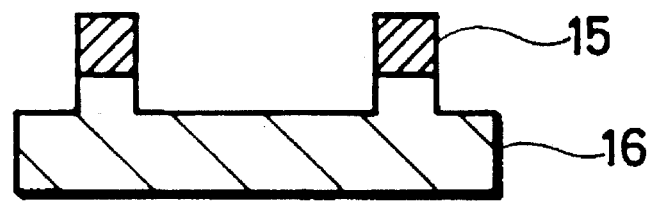
Figure 7C:
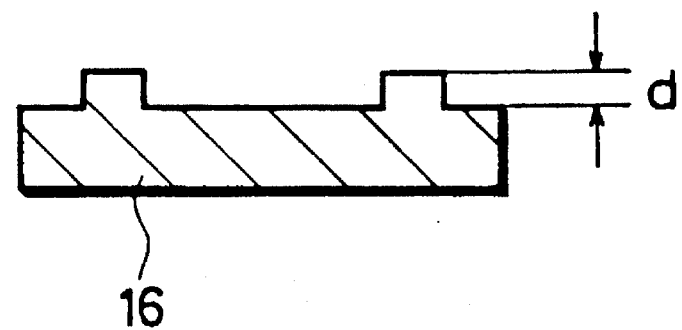

Prior to the description of the result of FIG. 6, a description is made referring to FIGS. 7A to 7C of how the etching speed is obtained. First, referring to FIG. 7A, a semiconductor substrate 16 was prepared on which a mask 15 of an oxide film was formed. A p type (100) silicon substrate having resistance of 1–100 ω·cm was used as a semiconductor substrate 16. Referring to FIG. 7B, etching was performed under a predetermined etching condition (100% HCl: 700 sccm, atmosphere pressure: 7.2 Torr, with and without irradiation from a low pressure mercury lamp). Then, referring to FIG. 7C, a mask 15 was removed to obtain etching depth d. The etching speed was obtained from this etching depth d.

As described above, etching speed was obtained at various temperatures with and without irradiation of ultraviolet rays. FIG. 6 is an Arrhenius plot showing the etching speed obtained in this way as a function of temperature.

Referring to FIG. 6, it is recognized that the etching speed was decreased as the temperature was lowered even with irradiation of ultraviolet rays and rapidly reduced at the bending point of 200° C. This fact shows that effective etching was not performed below 200° C. and effective etching was performed above 200° C. The plot in FIG. 6 shows that without the irradiation of ultraviolet rays, the etching speed was not increased very much even if the substrate temperature was raised up to 600° C., with the result that effective etching was not performed. Since those etching conditions are the same as those for removing the natural oxide film adapted by the method of the present invention, the result of FIG. 6 can be applied to that in case of the removing speed of the natural oxide film as it is.

As a result, it became apparent that removing treatment of the natural oxide film was not effectively performed by the synergistic effect of heat and light until the substrate temperature was heated at 200° C. with the irradiation of ultraviolet.

As apparent also from FIG. 6, the higher the temperature became, the higher the removing speed of the natural oxide film became if the temperature was above 200° C. However, as described above, if the temperature was raised excessively, unpreferable increase in grain diameter of crystalline material would be caused and the advantages of the low temperature pretreatment would be lost. As a tendency in recent device formation, polysilicon has preferably small crystal grain diameter, that is, it is preferably near amorphous and the substrate temperature is preferably below 600° C. as described above, but the device which is enough to be practically used can be obtained even at a temperature above 600° C. and also the removing speed of the natural oxide film can be made higher if the temperature is raised. However, if the temperature becomes above 700° C., the disadvantage that amorphous silicon is changed to polysilicon is emphasized rather than the above described advantage. Therefore, it is preferable that the treatment temperature of the semiconductor substrate is set at the temperature within the range of 200°~700° C.

Another embodiment of the present invention

Figure 8:
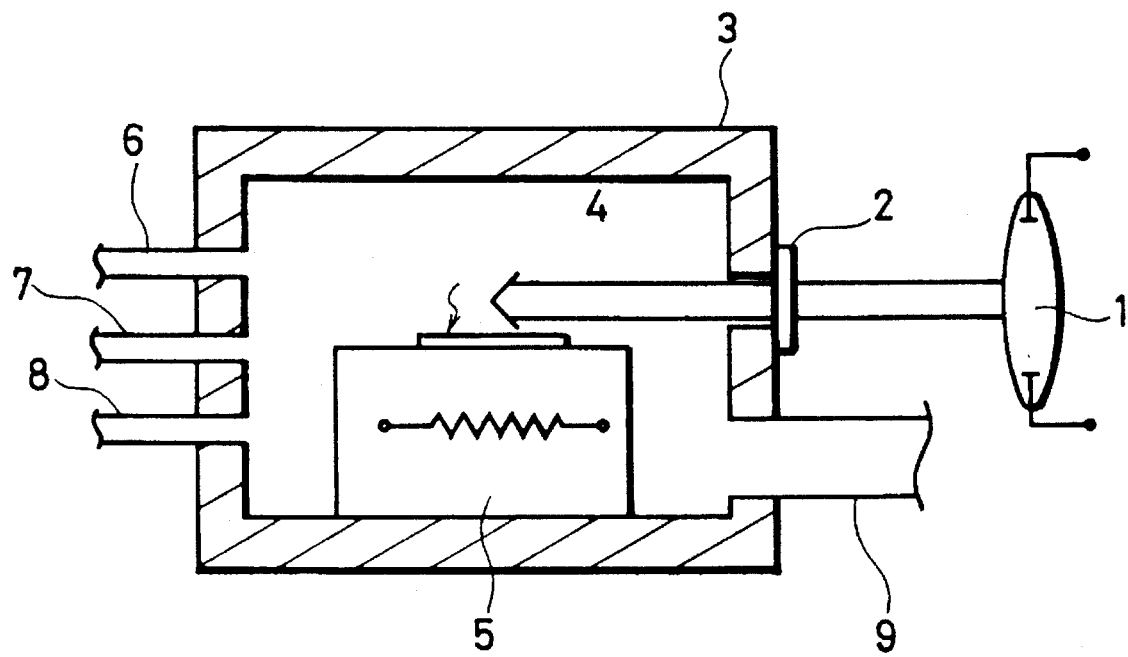
FIG. 8 is a sectional view of a device for implementing another embodiment of the present invention.

FIG. 8 is a sectional view of a device for implementing another embodiment of the present invention. Since the device shown in FIG. 8 is the same as the device shown in FIG. 1 except for the following points, the same references are allotted to the same or corresponding portions and a description thereof is omitted.

The device shown in FIG. 8 is different from the device shown in FIG. 1 in that an ultraviolet rays entrance window 2 is provided and a light source 1 is positioned such that light may be applied only to a reaction gas and may be irradiated parallel to a semiconductor substrate 4. In this structure, the light sources from which an excimer laser is irradiated, is preferably used as a light source. Since the device shown in FIG. 1 is structured such that the light may be directly applied to the substrate, if the excimer light is used as a light source, there is a fear that not only the natural oxide film but also the substrate will be etched. However, the removing speed of the natural oxide film can be increased without any such fear if the device shown in FIG. 8 is used.

Further embodiment of the present invention

Figure 9A:
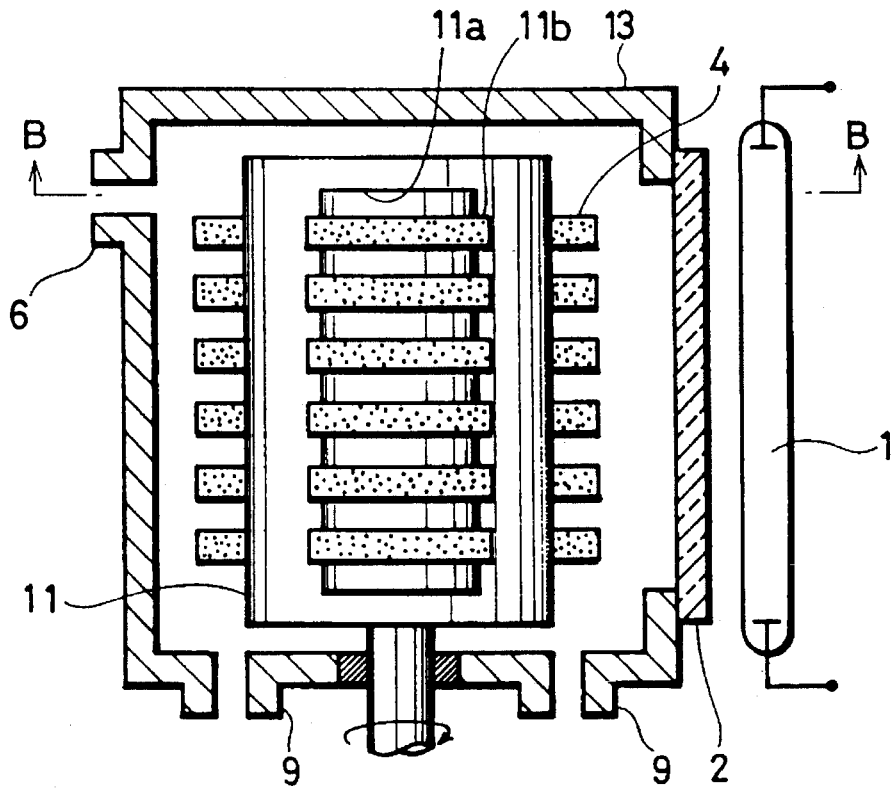
FIG. 9A is a front sectional view of a device for implementing a further embodiment of the present invention.
Figure 9B:
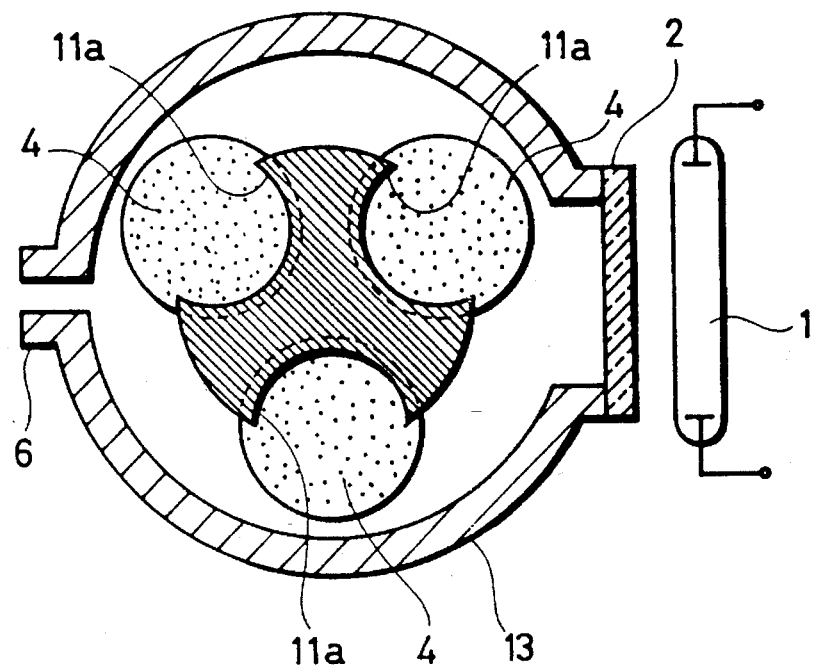
FIG. 9B is a sectional view taken along a line B—B in FIG. 9A.

FIGS. 9A are 9B are views of a device for implementing a further embodiment of the present invention. FIG. 9A is a front sectional view of the device and FIG. 9B is a sectional view taken along a line B—B in FIG. 9A.

This device is a batch type processing device capable of processing a large quantity of silicon substrates. The processing device comprises a chamber 13. A boat 11 capable of holding a plurality of silicon substrates 4 is placed therein. The boat 11 is cylindrical and has a plurality of trenches 11a extending vertically formed spaced apart from each other on the sidewall thereof. A plurality of holding trenches 11b holding the silicon substrate horizontally are formed vertically spaced apart from each other in respective trenches 11a. The boat 11 can be rotated upon its axis.

In addition, the chamber 13 comprises an ultraviolet rays entrance window 2 and the position of this ultra rays entrance window 2 is selected such that light may be irradiated parallel to the silicon substrate 4. A light source, for example a low pressure mercury lamp 1 is placed opposite to ultraviolet rays entrance window 2.

A description is made of a method for pretreating the semiconductor substrate surface.

The plurality of silicon substrates 4 were held in the boat 11. Since the silicon substrates 4 ware already exposed to the air after the solvent treatment, a natural oxide film was formed on the surfaces thereof. Then, the chamber 13 is evacuated. The surfaces of the silicon substrates 4 in the chamber 13 and an introduced reaction gas such as hydrogen fluoride gas are irradiated with ultraviolet rays from the light source such as the low pressure mercury lamp through the ultraviolet rays entrance window 2, while the reaction gas such as HCl gas is introduced through the cleaning gas inlet 6. At this time, the temperature of the silicon substrates 4 is raised with heat generated by light irradiation. The natural oxide film on the semiconductor substrates can be removed by this heat, the continuously irradiated light and the introduced HCl gas. Thereafter, the HCl gas is evacuated through the outlet 9 and then if the thin film is continuously formed without being exposed to the air in the device, a thin film having well-controlled interface structure between the silicon substrate 4 and the thin film can be formed.

Still another embodiment of the present invention

Figure 10A:
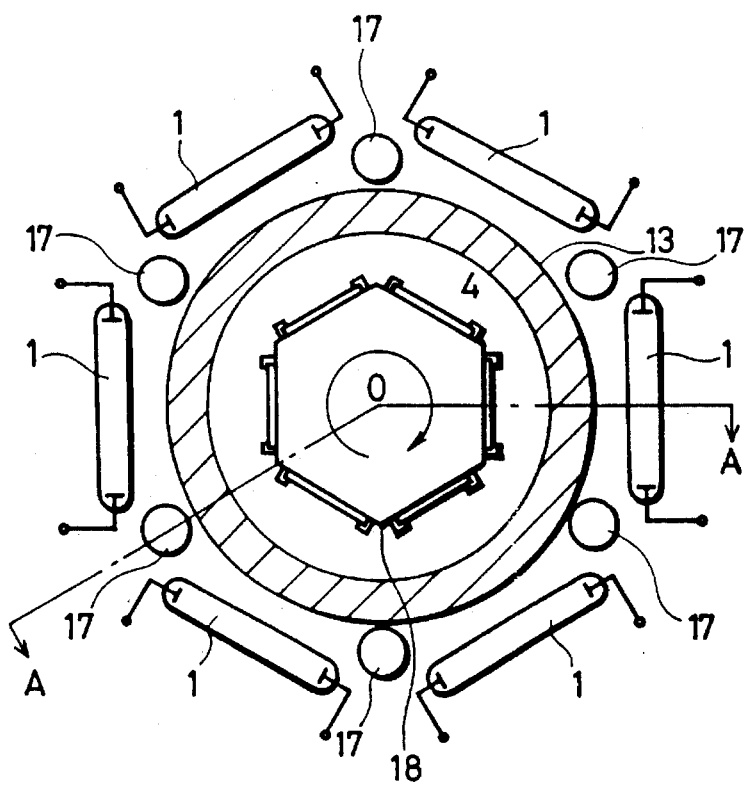
Figure 10B:
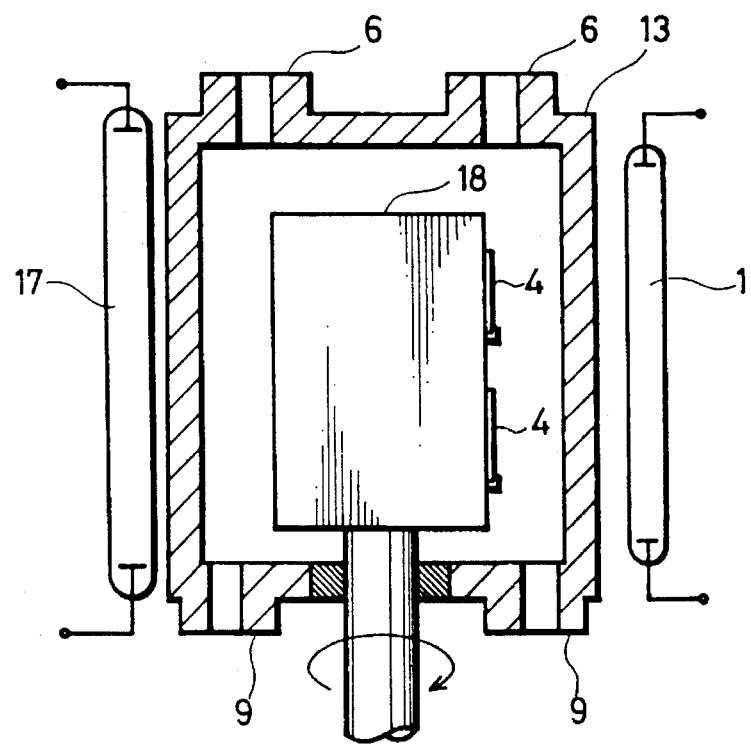

FIGS. 10A and 10B are views of a device for implementing still another embodiment of the present invention. FIG. 10A is a plan sectional view of the device and FIG. 10B is a sectional view taken along a line A—A in FIG. 10A.

This device is also a batch type processing device capable of processing a large quantity of silicon substrates. Referring to these figures, the processing apparatus comprises a cylindrical chamber 13 formed of a material having the permeability of ultraviolet rays such as quartz. A prism-shaped rotating susceptor 18 capable of holding the plurality of silicon substrates 4 is placed in the chamber 13. Each silicon substrate 4 is held on the rotating susceptor 18 such that the back side of the silicon substrate 4 contacts the surface of the rotating susceptor 18. The chamber 13 comprises a cleaning gas inlet 6 introducing a cleaning gas such as HCl and an outlet 9. An ultraviolet rays lamp 1 for photochemical reaction and an infrared rays lamp 17 for heating the substrate are placed alternately around the chamber 13.

A description is made of a method for pretreating the semiconductor substrate surface. The plurality of silicon substrates 4 are held by the rotating susceptor 18 and the rotating susceptor 18 is rotated on its axis. Since each silicon substrate 4 was exposed to the air after solvent treatment, a natural oxide film has been formed on the surface. The chamber 13 is evacuated through the outlet 9. Then, the reaction gas such as HCl gas is introduced through the cleaning gas inlet 6. At the same time, the mercury lamp 1 and the infrared rays lamp 17 are turned on to irradiate ultraviolet rays and infrared rays into the chamber 13. At this time, the temperature of the silicon substrate 4 is raised by the infrared rays. The natural oxide film on the semiconductor substrate is removed by this heat, the ultraviolet rays and the introduced HCl gas. Thereafter, by replacing the reaction gas in the chamber 13 with a gas for film formation, a film can be continuously formed on the substrate after cleaning without being exposed to the air. Many substrates can be processed in one treatment by using this device.

Although the above embodiment was of a case where a HCl gas was used as an etching gas, any gas capable of absorbing light at an ultraviolet rays region such as chlorine gas, hydrogen gas or the like can be used. In addition, as a light source for photochemical reaction, high pressure mercury lamp, mercury xenon lamp, Argon-arc lamp, ArF excimer laser light, KrF excimer laser light or XeCl excimer laser light may be used.

As described above, according to the present invention, both light and heat are used to remove a natural oxide film or contaminant adhering on the surface of a semiconductor substrate by a reaction gas. A natural oxide film can be removed by reaction of the reaction gas with the natural oxide film in the present invention and this reaction can be promoted by the synergistic effect of light and heat. Therefore, even if the reaction gas is not capable of being activated only by light, the natural oxide film can be removed. In addition, even when the natural oxide film can be removed only under high temperature, the natural oxide film can be removed at a room temperature with the help of the light. As a result, the natural oxide film on the semiconductor substrate surface can be removed at a sufficiently low temperature without damaging the surface of the semiconductor substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for pretreating a silicon semiconductor substrate in order to remove a natural oxide film or contaminant adhering on a surface of the semiconductor substrate, said method comprising the steps of:

placing said silicon semiconductor substrate in a chamber;

introducing into said chamber a reaction gas capable of reacting with said natural oxide film or said contaminant, said reaction gas comprising HCl;

heating said semiconductor substrate at a temperature in the range of 200°–700° C., and irradiating the reaction gas introduced into said chamber with light at said temperature in the range of 200°–700° C., while said semiconductor substrate is heated, said light having a wavelength which causes a photochemical reaction of the natural oxide film or contaminant adhering on said semiconductor substrate surface with said reaction gas.

2. A method for pretreating a semiconductor substrate in accordance with claim 1, wherein a low pressure mercury lamp is used as a light source for irradiating said reaction gas.

3. A method for pretreating a semiconductor substrate in accordance with claim 1, wherein a pressure of an atmosphere of said reaction gas is selected in the range of from atmospheric pressure to 0.1 Torr.

4. A method for pretreating a silicon semiconductor substrate in order to remove a natural oxide film or contaminant adhering on a surface of the semiconductor substrate, said method comprising the steps of:

placing said silicon semiconductor substrate in a chamber;

introducing into said chamber a reaction gas capable of reacting with said natural oxide film or contaminant, said reaction gas comprising HCl;

heating the semiconductor substrate at a temperature in the range of 200°–700° C. by irradiating said semiconductor substrate with light; and irradiating the reaction gas introduced into said chamber with light at said temperature in the range of 200°–700° C., while said semiconductor substrate is heated, said light having a wavelength which causes a photochemical reaction of the natural oxide film or contaminant adhering on said semiconductor substrate surface with said reaction gas.

5. A method for pretreating a semiconductor substrate in accordance with claim 4, wherein an infrared ray lamp is used as a light source irradiating light for heating said semiconductor substrate.

6. A method for pretreating a semiconductor substrate in accordance with claim 4, wherein a low pressure mercury lamp is used as a light source irradiating light which causes said photochemical reaction.

7. A method for pretreating a semiconductor substrate in accordance with claim 4, wherein a pressure of an atmosphere of said reaction gas is selected in the range of from atmospheric pressure to 0.1 Torr.

8. A method for pretreating a silicon semiconductor substrate in order to remove a natural oxide film or contaminant adhering on a surface of the silicon semiconductor substrate, said method comprising the steps of:

placing said silicon semiconductor substrate in a chamber;

introducing HCl gas into the chamber;

heating said silicon semiconductor substrate at a temperature in the range of 200°–700° C., and irradiating said HCl gas with an excimer laser which is introduced into said chamber along a path parallel with the surface of said silicon semiconductor substrate.

9. A method for pretreating silicon semiconductor substrates in order to remove a natural oxide film or contaminant adhering on the surface of the silicon semiconductor substrates, said method comprising the steps of:

placing into a chamber a rotating susceptor capable of holding a plurality of the silicon semiconductor substrates;

mounting the plurality of the silicon semiconductor substrates on the rotating susceptor such that the back side of each silicon semiconductor substrate contacts the surface of the rotating susceptor;

introducing HCl gas into the chamber;

rotating the rotating susceptor with the plurality of the silicon semiconductor substrates; and irradiating each silicon semiconductor substrate with infrared rays and irradiating the HCl gas with ultraviolet rays.

10. A method for pretreating silicon semiconductor substrates in accordance with claim 9, wherein the silicon semiconductor substrates are heated at a temperature in the range of 200° to 700° C.

* * * * *